United States Patent
Olszak et al.

(10) Patent No.: US 6,987,259 B2
(45) Date of Patent: Jan. 17, 2006

(54) IMAGING SYSTEM WITH AN INTEGRATED SOURCE AND DETECTOR ARRAY

(75) Inventors: Artur G. Olszak, Tucson, AZ (US); Chen Liang, Tucson, AZ (US)

(73) Assignee: DMetrix, Inc., Tucson, AZ (US)

(*) Notice: Subject to any disclaimer, the term of this patent is extended or adjusted under 35 U.S.C. 154(b) by 39 days.

(21) Appl. No.: 10/158,633

(22) Filed: May 30, 2002

(65) Prior Publication Data

US 2003/0222198 A1 Dec. 4, 2003

(51) Int. Cl.
*H01L 27/00* (2006.01)
(52) U.S. Cl. .................. 250/208.1; 250/208.2
(58) Field of Classification Search ............. 250/208.1, 250/208.2, 221, 216
See application file for complete search history.

(56) References Cited

U.S. PATENT DOCUMENTS

| | | | | |
|---|---|---|---|---|
| 3,858,043 A | * | 12/1974 | Sick et al. ................ | 250/221 |
| 4,407,008 A | | 9/1983 | Schmidt et al. ............ | 348/79 |
| 5,239,178 A | | 8/1993 | Derndinger et al. ........ | 250/234 |
| 5,923,466 A | * | 7/1999 | Krause et al. ............. | 359/389 |
| 6,628,385 B1 | * | 9/2003 | Osipchuk et al. .......... | 356/318 |
| 2003/0034439 A1 | * | 2/2003 | Reime et al. ............. | 250/221 |

FOREIGN PATENT DOCUMENTS

WO      WO 00/25165      5/2000

* cited by examiner

*Primary Examiner*—Thanh X. Luu
(74) *Attorney, Agent, or Firm*—Birdwell & Janke, LLP (57) ABSTRACT

An imaging system with an integrated source and detector array. A plurality of light detectors are arranged in a detector array and a plurality of light sources corresponding to detectors in the detector array are arranged in a source array in an epi-illumination system so that light radiated from a point on the object illuminated by a given source is detected by a corresponding detector. An optical system is disposed with respect to the source array and the detector array so as to illuminate an object with light from the source array and image the object on the detector array. Ordinarily, the sources and detectors are coplanar and, preferably, are fabricated or at least mounted on the same substrate. One or more sources in the source array may have a corresponding plurality of detectors, and one or more detectors in the detector array may have a corresponding plurality of sources. In one embodiment the Airy pattern of the point response of the optical system encompasses both a detector and its corresponding light sources. In another embodiment, the optical pathway is split by a diffractive element to produce conjugate points corresponding to light sources and their respective detectors. In a further embodiment, the pathway is split by a Wollaston prism. In yet another embodiment where the illumination and image light have different wavelengths, the pathway is split by dispersion. The system is particularly suited for fluorescence imaging, confocal microscopy and array microscopes.

39 Claims, 11 Drawing Sheets

IMAGING SYSTEM WITH AN INTEGRATED SOURCE AND DETECTOR ARRAY

FIELD OF THE INVENTION

This invention relates to illumination for optical imaging systems, particularly to an integrated detector and source array for epi-illumination in an imaging system, and more particularly in an array microscope.

BACKGROUND OF THE INVENTION

In an imaging system, adequate and appropriate illumination of the object to be imaged is essential. There must be enough light provided to the object to permit a viewer or detector to discern features of the object in the image thereof. In addition, the manner in which the light is provided to the object makes a difference in what features can be detected and the contrast with which they are imaged.

The way in which illumination is provided is particularly important in a microscope. If the object is opaque, it must be illuminated so that the light used to form an image of the object is radiated from the same side of the object on which light illuminates the object. This type of illumination is known primarily as epi-illumination. In epi-illumination the light radiated from an object may be in the form of reflection, in which case the illumination light is modulated upon reflection from the object, or it may be in the form of fluorescence, in which case the illumination light induces fluorescent emission by the object at a different wavelength from the illumination light, as determined by the fluorescence characteristics of the object. The latter case is known as epi-fluorescence. The term "radiated" is used throughout this specification and the claims hereof to include reflection, scattering and fluorescence.

One type of epi-illumination is critical illumination. In this case, the light source is imaged into the object plane. This provides efficient illumination and a short illumination system, but requires that the light source provide uniform radiance. The light source is ordinarily disposed actually or virtually on the optical axis of the imaging lens.

In the foregoing it is assumed that the entire field of view of the imaging lens is simultaneously imaged. However, in a confocal microscope only discrete points in object space are imaged. This is accomplished by placing one or more "pinhole" stops at the image plane of the microscope matched to corresponding discrete points in the object plane, and scanning the object laterally, either by moving the object or the microscope, or moving the scanning the beam through the microscope using, for example, scan mirrors. The light passed by the pinhole is detected and related to the object position as the scan occurs, and the output of the detector is used to produce an image of the object as a whole. In this case, light from the light source is focused to the point on the object plane that is currently imaged. This is typically accomplished by placing a beam splitter between the imaging lens and the image plane so as to pass image light to the image plane while reflecting source light from a virtual image plane created by the beam splitter along the optical axis of the microscope toward the object plane.

In classic optical instruments employing critical illumination, the image is detected by the human eye. In many modern optical instruments, the image is detected by a photo-sensitive device, typically an array of photodetectors. In confocal microscopy, the image is necessarily detected by some storage means. While the use of electronic image detection offers electronic capture of an image and the possibility of reducing the size of an imaging system, effective, compact epi-illumination has remained a challenge.

The recent development of array microscopes, also known as miniaturized microscope arrays, presents new challenges for illumination. In array microscopes a plurality of laterally-distributed optical imaging elements having respective longitudinal optical axes are configured to image respective sections of an object and disposed with respect to a common object plane so as to produce at respective image planes respective images of the respective sections. The individual lenses of this array are formed of small optical elements, or "lenslets," that place severe constraints on providing illumination. Indeed, the multiplicity of lenslets arranged in an array and the small dimensions of the array suggest that prior art epi-illumination techniques cannot be used. Yet, a principal application for array microscopes is to image specimens, such as biological microarrays for protein analysis that are sufficiently opaque that dia-illumination cannot be used effectively.

Accordingly, there is a need for novel systems and methods for providing critical illumination in epi-illumination imaging systems employing electronic image detection.

SUMMARY OF THE INVENTION

The present invention meets the aforementioned need by providing, in an imaging system, a plurality of light detectors arranged in a detector array and a plurality of light sources corresponding to detectors in the detector array, so that light radiated from a point on the object illuminated by a given source of the source array is detected by a corresponding detector of the detector array. An optical system is disposed with respect to the detector array and the source array so as to illuminate an object with light from the source array and image the object on the detector array. Corresponding detectors and sources are disposed in back of the optical system and interspersed among one another. Ordinarily, the sources and detectors are coplanar, and preferably are fabricated or at least mounted on the same substrate. One or more sources may have a plurality of corresponding detectors, and one or more detectors may have a plurality of corresponding sources.

In one embodiment the Airy pattern point response of the optical system encompasses both a detector and its corresponding light sources. In another embodiment, the optical pathway is split by a diffractive element to produce conjugate points coupled to sources and their respective detectors. In a further embodiment, the pathway is split by a Wollaston prism. In yet another embodiment where the illumination and image light have different wavelengths, the pathway is split by dispersion. The system is particularly suited for fluorescence imaging, confocal microscopy and array microscopes.

Accordingly, it is a principal objective of the present invention to provide novel systems and methods for epi-fluorescence imaging.

The foregoing and other objectives, features, and advantages of the invention will be more readily understood upon consideration of the following detailed description of the invention, taken in conjunction with the accompanying drawings.

DETAILED DESCRIPTION OF THE INVENTION

In a modern imaging system having electronic image detection, the image is typically detected by an array of photodetectors disposed in the image plane of the imaging system. The array may be two-dimensional or one-dimensional. In any event, each photodetector is customarily the source of one pixel of data, though in the case of a color imaging system where one photodetector is provided for each color to be detected one pixel may have multiple photodetectors associated with it. The present invention employs such an array of photodetectors, the improvement being that light sources are interspersed in the array among the photodetectors. In this case, each pixel has one or more light sources, as well as one or more photodetectors, associated with it. Ordinarily, the sources and detectors are coplanar and, preferably, fabricated or at least mounted on the same substrate; however, for some applications the sources and detectors may lie in different planes, though laterally interspersed with one another.

Figure 1A:
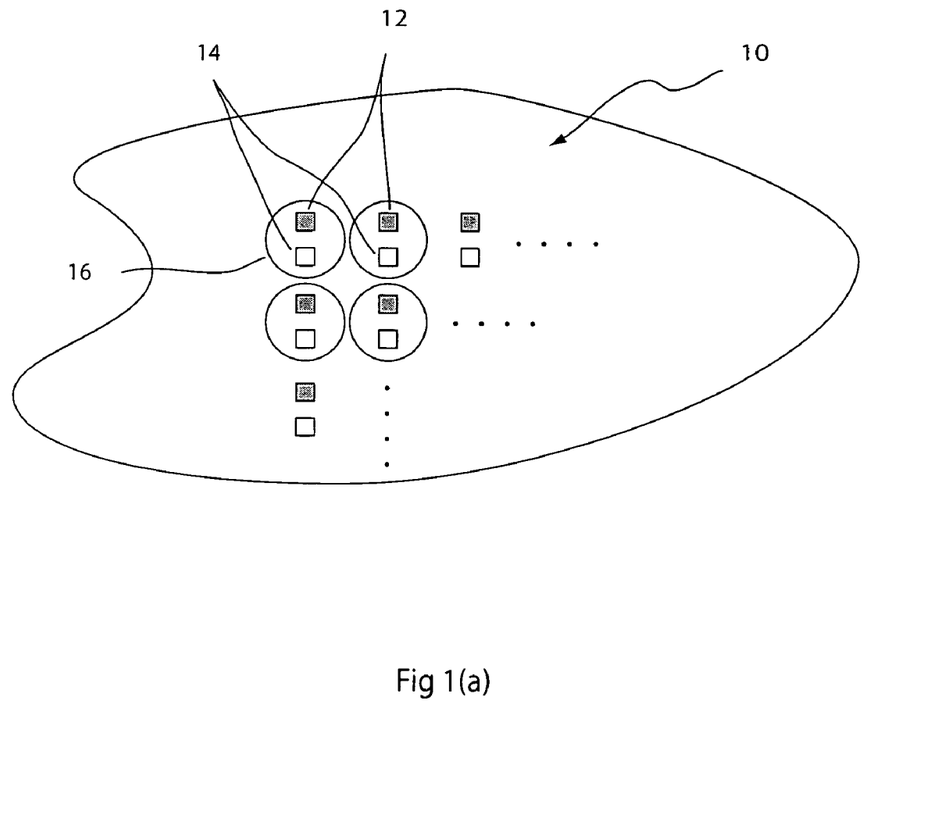
FIG. 1(a) is an axial view of a two-dimensional integrated source and detector array according to the present invention.

FIGS. 1(a), 1(b), 1(c) and 1(d) show exemplary integrated photodetector and light source arrays according to the present invention. In FIG. 1(a) a two-dimensional array 10 of integrated photodetectors 12 and light sources 14 is shown, each photodetector having a light source associated therewith as shown by circle 16. The individual photodetectors 12 may be any practical opto-electonic photo-sensitive device small enough to provide the desired image resolution, such as CMOS photodiodes, as is commonly understood in the art. The light sources 14 are preferably light-emitting diodes or laser diodes, depending on the type of illumination desired. Vertical cavity emitting semiconductor lasers are particularly suitable for this invention because they emit light perpendicular to their substrate and can produce unpolarized light. However, other light emitting devices small enough to fit within the array may be used, whether they are semiconductors, lasers or not, without departing from the principles of the invention.

Figure 1B:
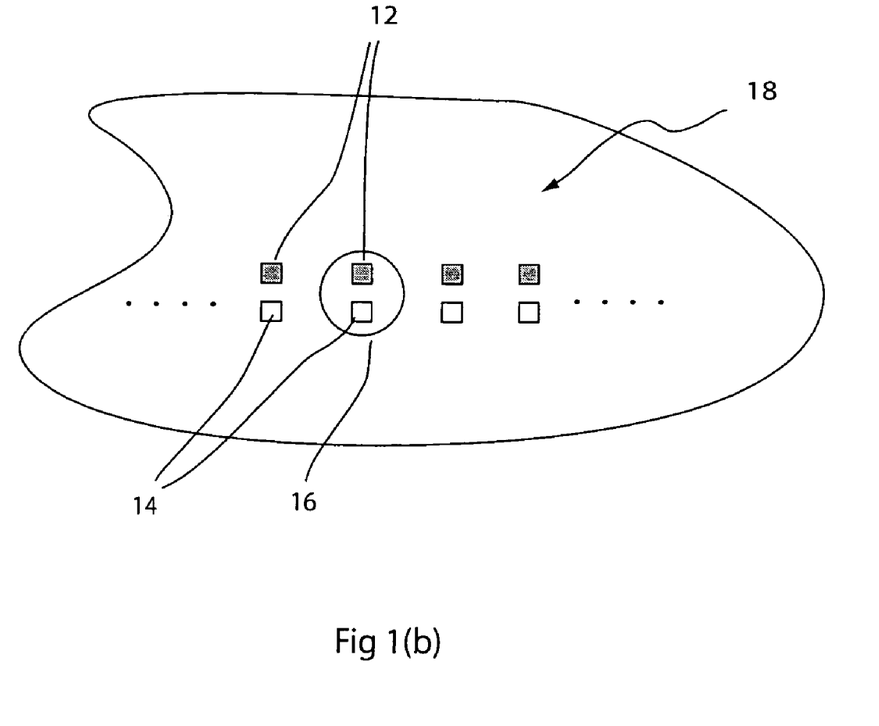
FIG. 1(b) is an axial view of a one-dimensional integrated source and detector array according to the present invention.
Figure 1C:
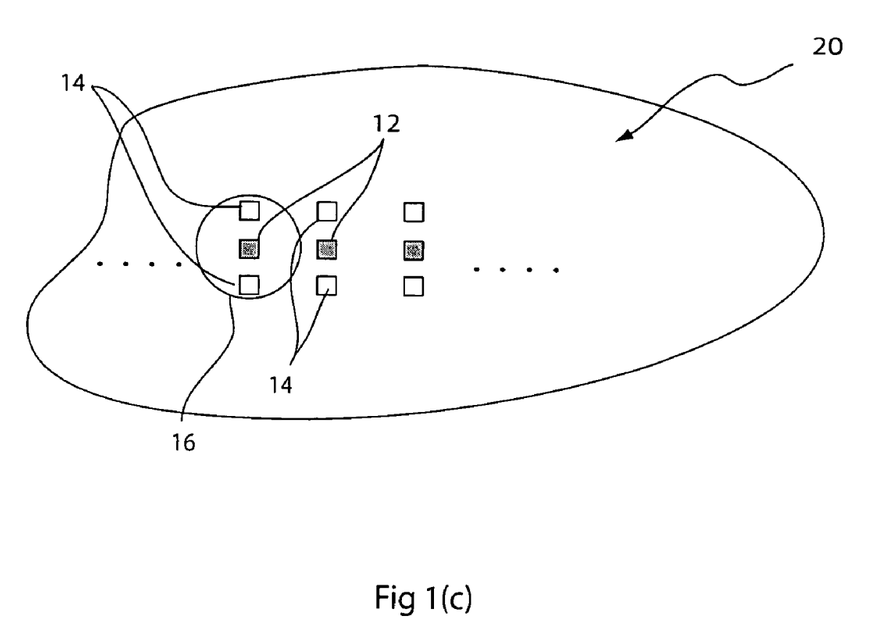
FIG. 1(c) is an axial view of a one-dimensional integrated source and detector array, wherein more than one light source is associated with a given detector, according to the present invention.
Figure 1D:
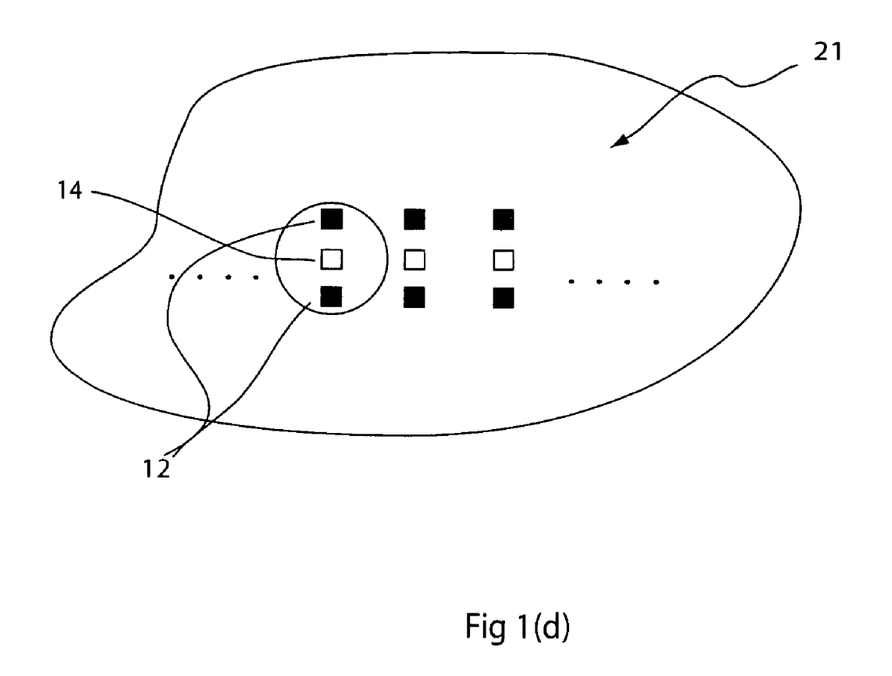
FIG. 1(d) is an axial view of a one dimensional integrated source and detector array wherein more than one detector is associated with a given light source, according to the present invention.

In FIG. 1(b) a one-dimensional integrated array 18 is shown where each photodetector 12 has only one light source 14 associated with it, as in FIG. 1(a). However, there may be applications which call for two or more light sources 14 associated with a single photodetector 12 in an integrated array 20, as shown in FIG. 1(c), or two or more photodetectors 12 associated with a single light source 14, as shown in FIG. 1(d).

Figure 2:
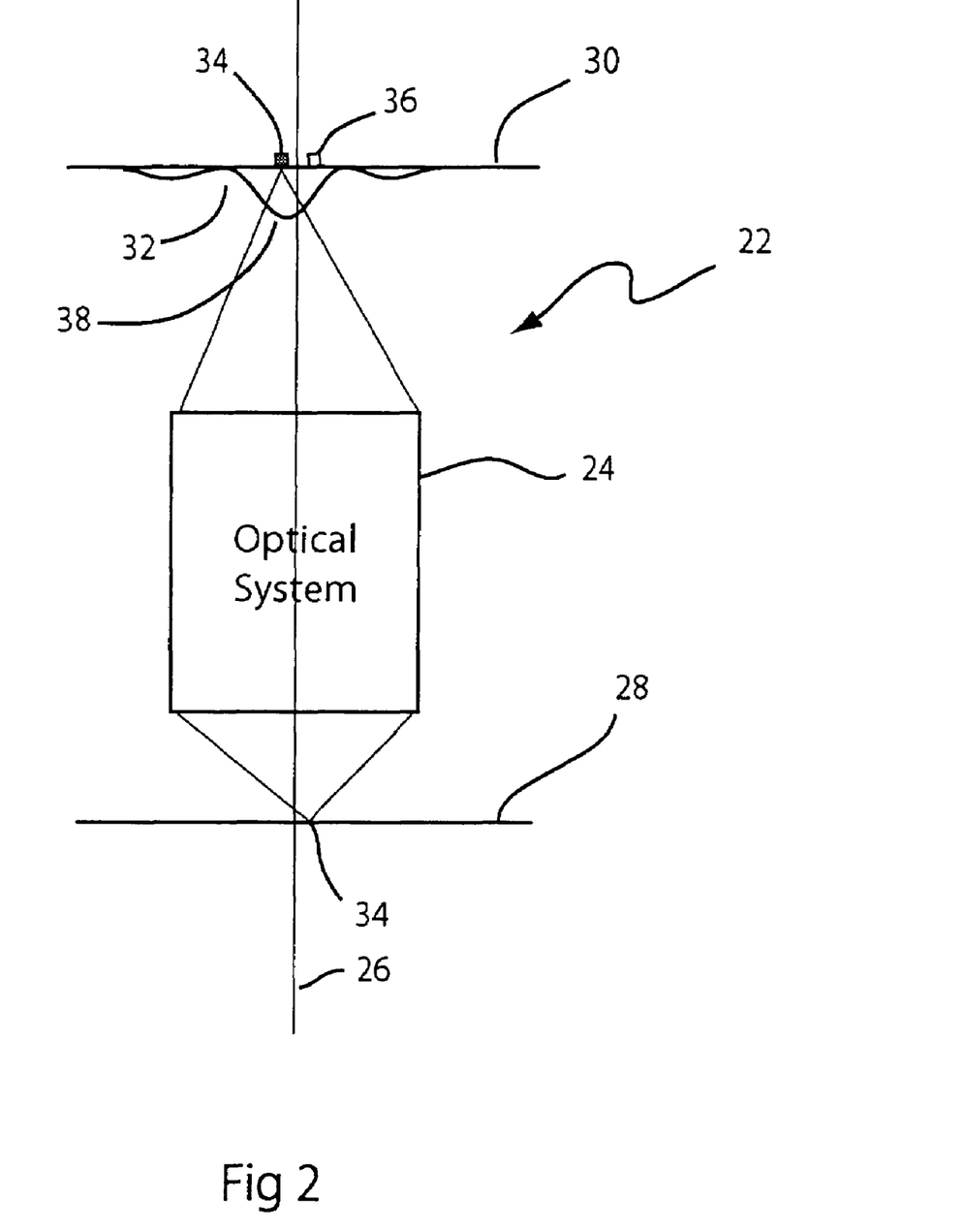
FIG. 2 is a side view and intensity-distribution diagram of an imaging system employing an integrated source and detector array in accordance with the present invention, wherein both the source and the detector lie within a predetermined portion of the Airy pattern of the point response of an imaging system.

Turning to FIG. 2, a first embodiment 22 of a one-dimensional integrated source and detector array epi-illumination system takes advantage of the diffraction-limited point response function of an optical system to provide both illumination and detection of the light at a point on an object to be imaged. An optical system 24 has an optical axis 26, an object plane 28 and an image plane 30. The optical system may be a single or multiple element system, a refractive element system, a reflective element system, a diffractive element system, or some combination of the foregoing, as appropriate for the particular application. In any case, the optical system produces an image 32 at the image plane of a point 34 on the object plane, the image of the point representing the impulse (point) response, or point spread function ("PSF"), of the optical system. The PSF will depend on the wavelength, the aperture of the optical system and the aberrations of the optical system. To the extent the system can be corrected to render the aberrations insignificant, the image will be effectively diffraction limited. In the case of a circularly symmetric aperture, the PSF will then be an Airy pattern, a two-dimensional cross section of which is shown as image 32 in FIG. 2. The source 34 and detector 36 can be positioned so that the central lobe 38 of the PSF covers both the source and the detector, provided that both the source and the detector are small enough, without spreading a significant amount of energy into an adjacent source and detector pair. In this manner, the source and detector act as a single point to the optics.

Figure 8:
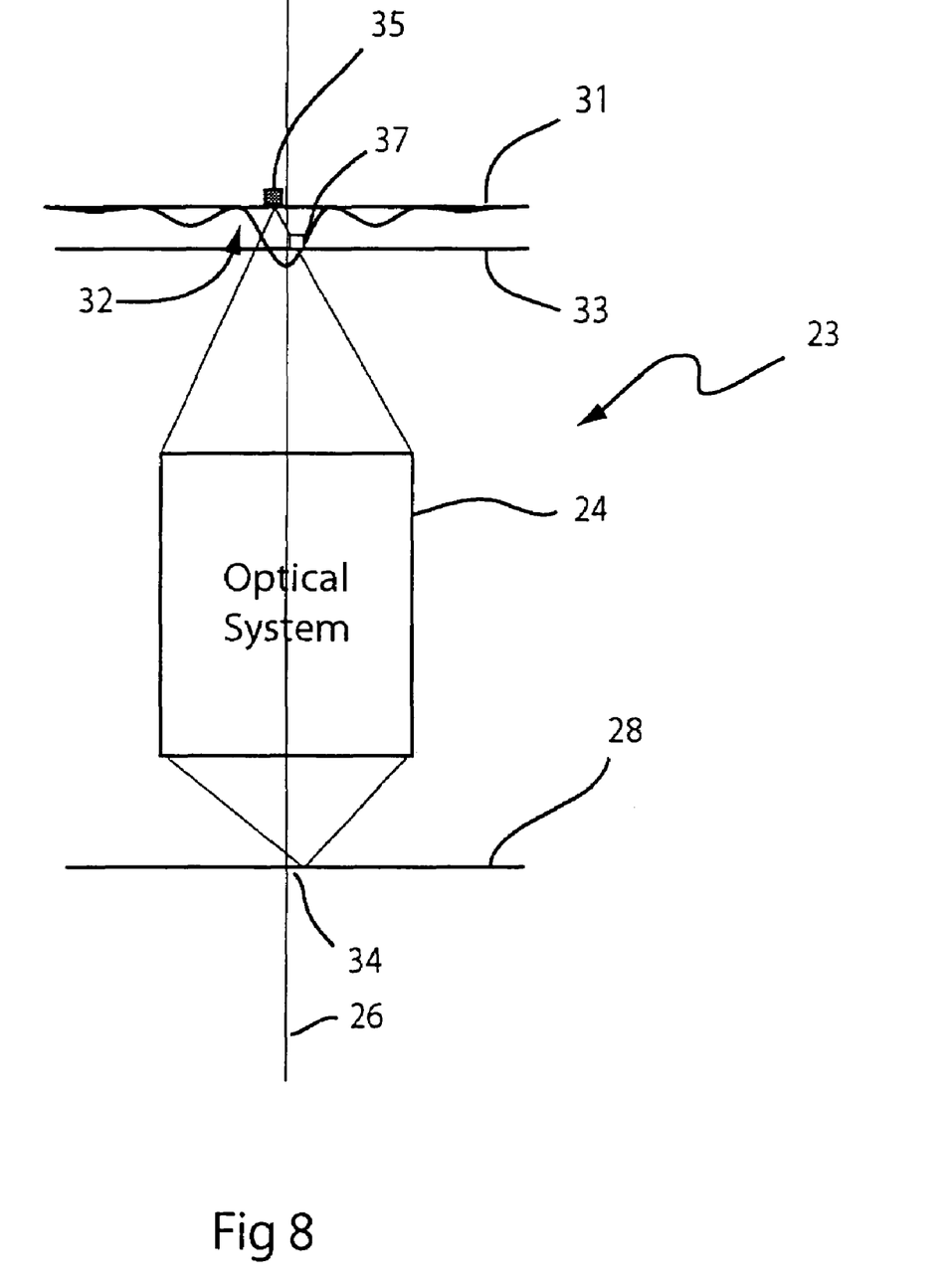
FIG. 8 is a side view and ray trace diagram of an imaging system employing an integrated source and detector according to the present invention, wherein the source array and the detector array are not coplanar with one another.

The embodiment 23 shown in FIG. 8 is similar to that shown in FIG. 2, except that the source 35 is in one plane 31 and the detector 37 is in another plane 33.

While this first embodiment does not provide optimal light efficiency, it is simple, compact, and straightforward to manufacture. It can be implemented with either a one-dimensional array, as shown in FIG. 1(b) or a two dimensional array, as shown in FIG. 1(a). To increase light efficiency, multiple detectors surrounding the light source within the central lobe of the image could be used. Also, the optical system can be designed to have desired aberrations so as to produce a non-symmetric PSF and maximize the light irradiating the detector area. As will be understood by a person skilled in the art, there are various ways of accomplishing this, including, for example, forming lenses with aspherical surfaces and decentering the elements of the optical system.

Figure 3:
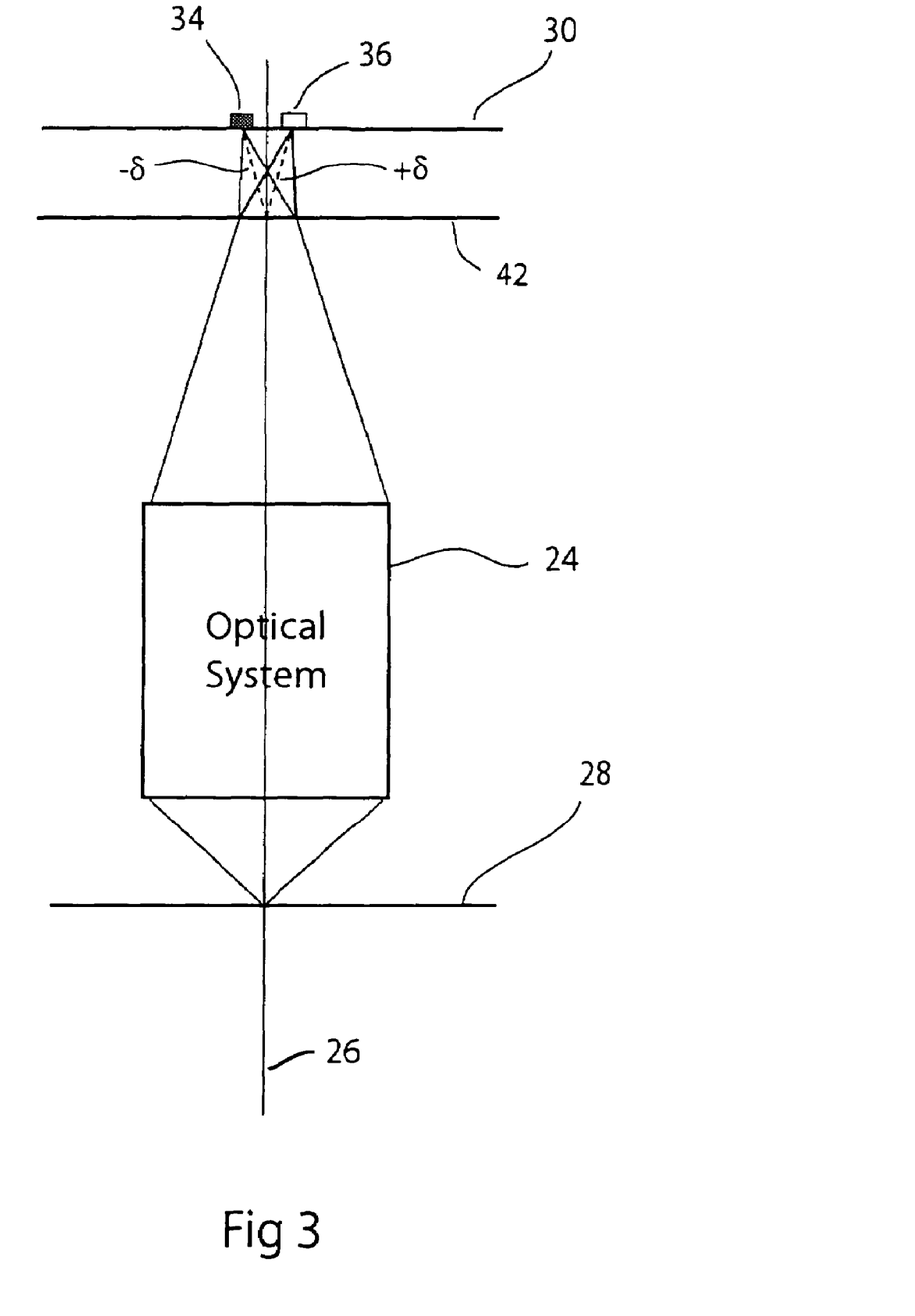
FIG. 3 a side view and ray trace diagram of an imaging system employing an integrated source and detector array according to the present invention, wherein a diffractive element is employed to produce conjugate points in image space.

A second embodiment 40 of a one-dimensional integrated source and detector array illumination system, shown in FIG. 3, uses a diffraction element to separate the illumination light from the image light at image plane. As in FIG. 2, the system has an optical system 24, with an optical axis 26, and object plane 28 and an image plane 30. A source 34 and detector 36, which are part of a linear array, are preferably disposed symmetrically about the optical axis at the image plane 30. In this case, a diffraction element 42 is also included. The diffraction element, which may be, for example, a grating or hologram, is preferably optimized to maximize the diffraction efficiency of the $+\delta$ and $-\delta$ first diffraction orders, while minimizing the diffraction efficiency of all other orders. The source and detector are then placed in the respective paths of those two orders, that is, coupled thereto, so that the source and detector are conjugate to one another and thereby provide optimum use of light.

Figure 4:
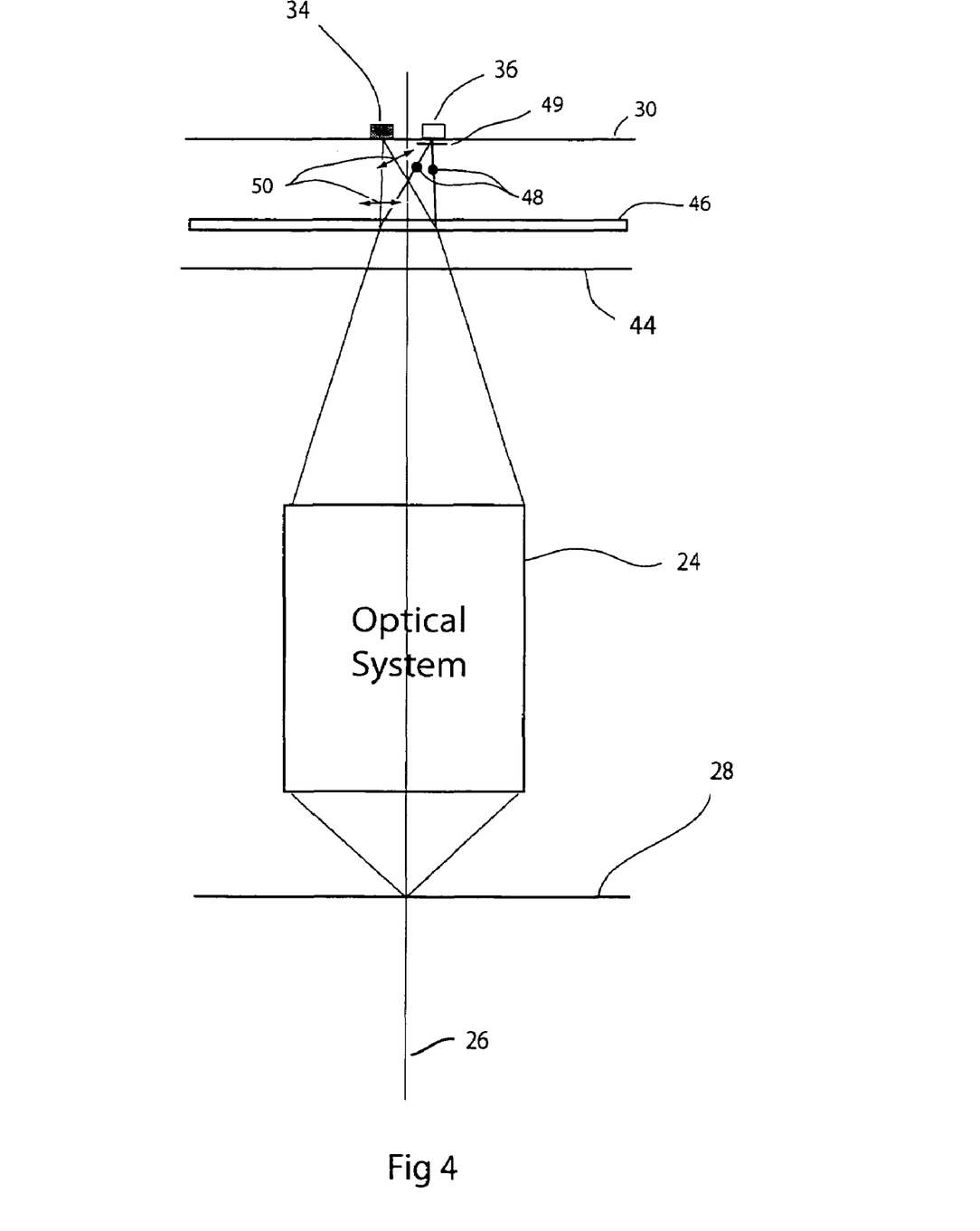
FIG. 4 is a side view and ray trace diagram of an imaging system employing an integrated source and detector array according to the present invention, wherein a Wollaston prism is employed to produce conjugate points in image space.

In a third embodiment, conjugate points on the image plane can be formed by a Wollaston prism. As shown in FIG. 4, a quarter wave plate 44 may be placed in front of a Wollaston prism 46 at an angle to the two eigenaxes thereof so that the optical pathway is split into two pathways having respectively orthogonal polarizations and respective angles of refraction, as indicated by the dot 48 and arrow 50. This requires either that the source 36 produce light that is linearly polarized in the direction represented by dots 48, or that a linear polarizer 49 be used to produce such linear polarization. The source light is then circularly polarized in one direction by the quarter wave plate, circularly polarized in the opposite direction upon reflection from the object, then linearly polarized in the direction of arrows 50 by the quarter wave plate. Thus, this arrangement creates two conjugate points in the image plane that correspond to a light source 34 and photo-detector 36, respectively.

Figure 5:
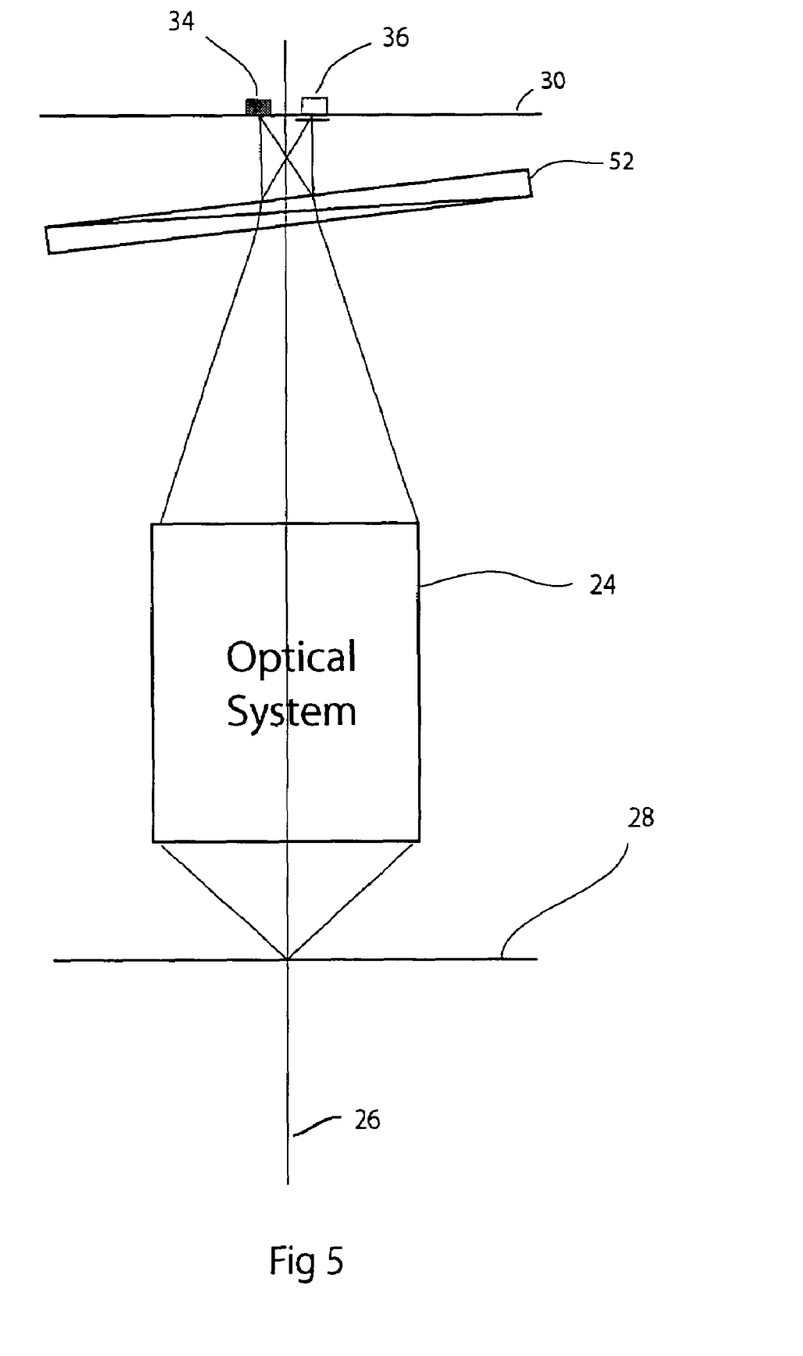
FIG. 5 is a side view and ray trace diagram of a fluoresence imaging system employing an integrated source and detector array according to the present invention, wherein a direct view prism is employed to produce conjugate points in image space.

In the case of fluorescence imaging, the dispersive qualities of optical elements can be employed to produce conjugate points in image space. In fluorescence imaging the light source has a first wavelength, or more generally a first energy spectrum, that excites the object to fluoresce and thereby emit light at a different wavelength, or more generally a different energy spectrum. In this case, the light sources 34 emit light at one wavelength, typically an ultraviolet wavelength, and the photo-detectors 36 either are sensitive to a different wavelength or associated with filters that limit the spectrum received thereby to a different wavelength. For example, a direct vision prism 52 splits the optical pathway 54 into two branches corresponding to the excitation and fluorescence emission wavelengths, respectively, as shown in the embodiment of FIG. 5. Thus, it creates two conjugate points in the image plane that correspond to a light source 34 that emits light at one wavelength and photo-detector 36 that is responsive to another wavelength. A number of detectors can be used as well to detect light corresponding to a corresponding number of different wavelengths, such as red, green and blue light.

Generally, any device that conjugates spatially-separated points corresponding respectively to light sources and photo-detectors in image space for epi-illumination may be used without departing from the principles of the invention.

While the light source array and photodetector array are ordinarily coplanar for producing critical illumination, they can be disposed in axially separate planes. This may be desirable, for example, to compensate for axial dispersion in fluorescence imaging. In that case, the array of light sources is placed at the image plane for the excitation light, while the photodetector array is placed at the image plane of the wavelength of light to be detected.

Figure 6:
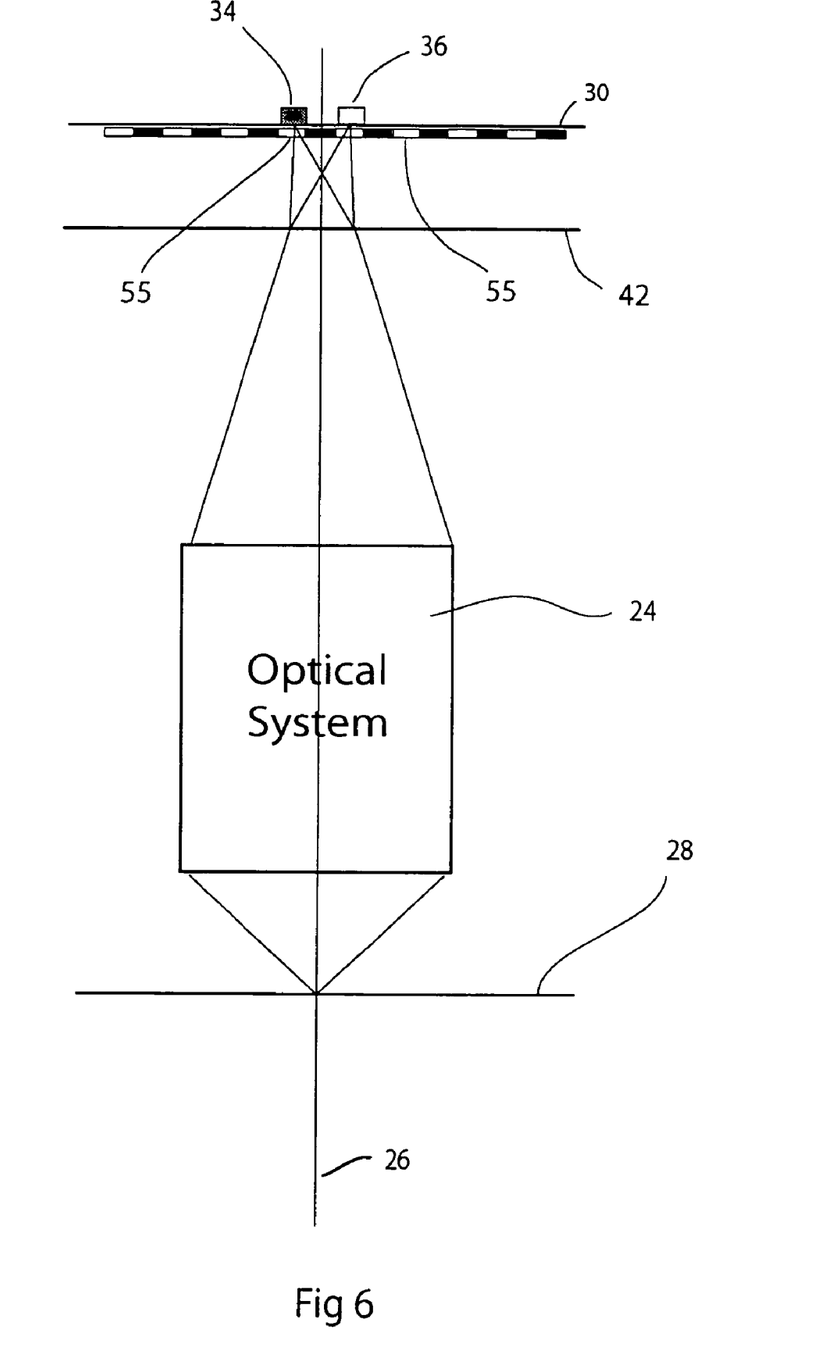
FIG. 6 is a side view and ray trace diagram of a confocal imaging system employing an integrated source and detector array according to the present invention, wherein a diffractive element is employed to produce conjugate points in image space.

The embodiments of FIGS. 2–5 can also be used in a confocal mode, as shown with respect to the second embodiment in FIG. 6. In this case, a stop is provided with an array of pinhole apertures 55, one for each detector 34, and with conjugate apertures for the light sources 36. The image of each source, which is essentially a point source, is conjugated with the object plane. After reflection from the object, the light is imaged onto a corresponding pinhole aperture 54. The amount of light that passes through the aperture is closely related to the focus of the image and can be used to gauge the distance of the object surface to the focal position. If the object and the light beam are then moved with respect to one another, the profile of the object can thereby be determined. By providing a linear array of source-detector pairs and scanning the object in a direction perpendicular to the array, rapid confocal scanning can be achieved.

Figure 7:
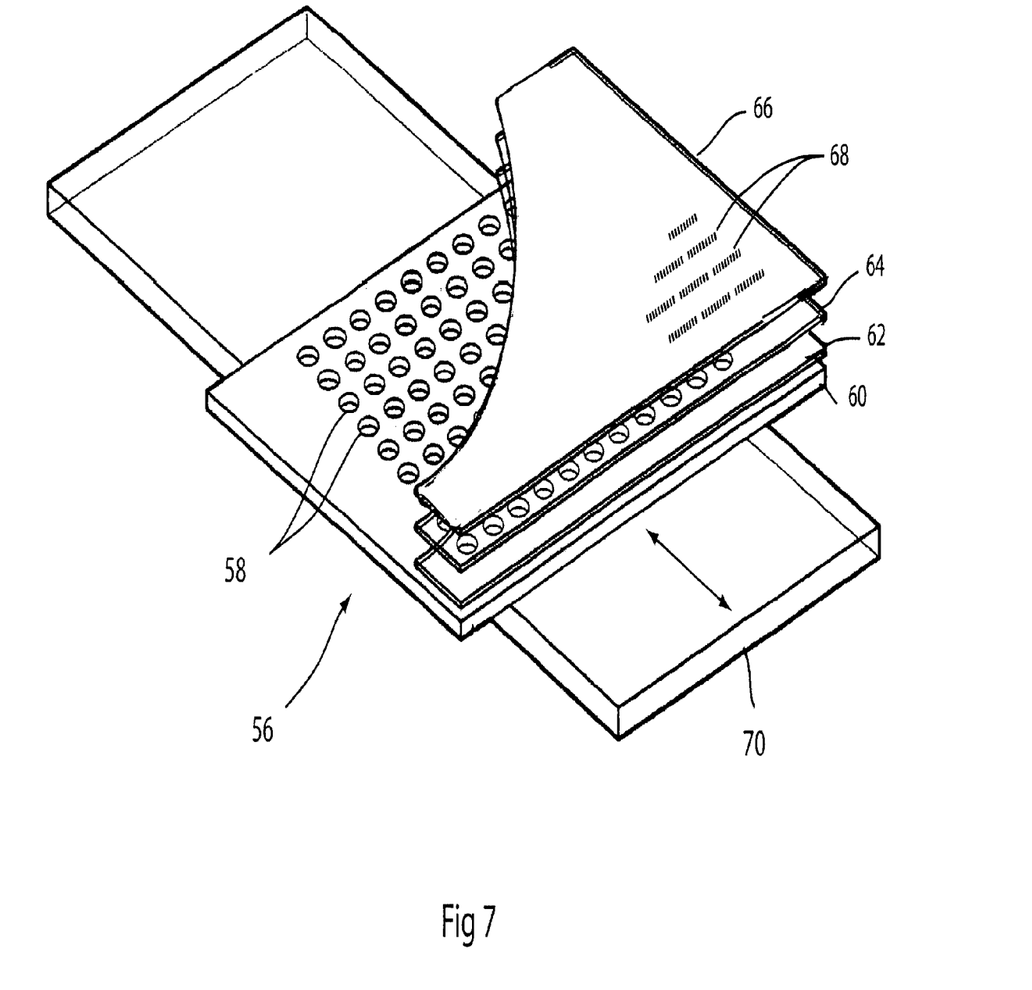
FIG. 7 is a perspective view of an illustrative array microscope incorporating an integrated source and detector array according to the present invention.

The embodiments of FIGS. 2–6 can be employed in an array microscope, as shown in FIG. 7. An exemplary embodiment of an array microscope 56 comprises pluralities of lenses 58, corresponding to individual microscope elements, disposed on respective lens plates 60, 62 and 64, which are stacked along the optical axes of the microscope elements. An array 66 of linear, integrated source-detector arrays 68 resides above the last lens plate. The array microscope 66 is typically employed to scan a sample on a carriage 70 as the carriage is moved with respect to the array or vice versa. Each set of corresponding lenses 58 and respective lens plates 60, 62 and 64 images a section of the object onto a corresponding source-detector array 58 as the object moves by on the carriage 70.

The terms and expressions which have been employed in the foregoing specification are used therein as terms of description and not of limitation, and there is no intention, in the use of such terms and expressions, to exclude equivalents of the features shown and described or portions thereof, it being recognized that the scope of the invention is defined and limited only by the claims which follow.

We claim:

1. An imaging system comprising:
   a plurality of light detectors arranged in a detector array;
   a plurality of light sources corresponding to detectors in the detector array and arranged in a source array;
   an optical system disposed with respect to the source array and the detector array so as to illuminate an object with light from the source array and image the object on the detector array, corresponding detectors of the detector array and sources of the source array being disposed in back of the optical system and being arranged so that light radiated from a point on the object illuminated by a given source of the source array is detected by a corresponding detector of the detector array, the light sources being interspersed among the light detectors; and
   an energy splitting element disposed between the optical system, on the one hand, and the detectors and sources, on the other hand, to produce conjugate points in image space coupled respectively to corresponding sources and detectors.

2. An imaging system, comprising:
   a plurality of light detectors arranged in a detector array;
   a plurality of light sources corresponding to detectors in the detector array and arranged in a source array;
   an optical system disposed with respect to the source array and the detector array so as to illuminate an object with light from the source array and image the object on the detector array, corresponding detectors of the detector array and sources of the source array being disposed in back of the optical system and being arranged so that light radiated from a point on the object illuminated by a given source of the source array is detected by a corresponding detector of the detector array; and an energy splitting element disposed between the optical system, on the one hand, and the detectors and sources, on the other hand, to produce conjugate points in image space coupled respectively to corresponding sources and detectors, the energy splitting element comprising a diffractive element optimized to maximize energy in diffraction orders directed respectively toward corresponding detectors and sources.

3. An imaging system, comprising:

a plurality of light detectors arranged in a detector array;

a plurality of light sources corresponding to detectors in the detector array and arranged in a source array;

an optical system disposed with respect to the source array and the detector array so as to illuminate an object with light from the source array and image the object on the detector array, corresponding detectors of the detector array and sources of the source array being disposed in back of the optical system and being arranged so that light radiated from a point on the object illuminated by a given source of the source array is detected by a corresponding detector of the detector array; and an energy splitting element disposed between the optical system, on the one hand, and the detectors and sources, on the other hand, to produce conjugate points in image space coupled respectively to corresponding sources and detectors, the energy splitting element comprising a Wollaston prism, the imaging system further comprising a circular polarizer disposed between the optical system and the Wollaston prism so as to produce polarization components along both eigenaxes of the Wollaston prism.

4. An imaging system, comprising:

a plurality of light detectors arranged in a detector array;

a plurality of light sources corresponding to detectors in the detector array and arranged in a source array;

an optical system disposed with respect to the source array and the detector array so as to illuminate an object with light from the source array and image the object on the detector array, corresponding detectors of the detector array and sources of the source array being disposed in back of the optical system and being arranged so that light radiated from a point on the object illuminated by a given source of the source array is detected by a corresponding detector of the detector array; and an energy splitting element disposed between the optical system, on the one hand, and the detectors and sources, on the other hand, to produce conjugate points in image space coupled respectively to corresponding sources and detectors, wherein the sources emit light at a first wavelength, the detectors respond to light at a second wavelength different from the first wavelength, and the energy splitting element comprises a direct view prism.

5. An imaging system, comprising:

a plurality of light detectors arranged in a detector array;

a plurality of light sources corresponding to detectors in the detector array and arranged in a source array;

a microscope disposed with respect to the source array and the detector array so as to illuminate an object with light from the source array and image the object on the detector array, corresponding detectors of the detector array and sources of the source array being disposed in back of the optical system and being arranged so that light radiated from a point on the object illuminated by a given source of the source array is detected by a corresponding detector of the detector array, the light sources being interspersed among the light detectors; and an energy splitting element disposed between the microscope system, on the one hand, and the detectors and sources, on the other hand, to produce conjugate points in image space coupled respectively to corresponding sources and detectors.

6. An imaging system, comprising:

a plurality of light detectors arranged in a detector array;

a plurality of light sources corresponding to detectors in the detector array and arranged in a source array;

an optical system disposed with respect to the source array and the detector array so as to illuminate an object with light from the source array and image the object on the detector array, corresponding detectors of the detector array and sources of the source array being disposed in back of the optical system and being arranged so that light radiated from a point on the object illuminated by a given source of the source array is detected by a corresponding detector of the detector array, the optical system comprising a microscope; and an energy splitting element disposed between the optical system, on the one hand, and the detectors and sources, on the other hand, to produce conjugate points in image space coupled respectively to corresponding sources and detectors, wherein the energy splitting element comprises a diffractive element optimized to maximize energy in diffraction orders directed respectively toward corresponding detectors and sources.

7. An imaging system, comprising:

a plurality of light detectors arranged in a detector array;

a plurality of light sources corresponding to detectors in the detector array and arranged in a source array;

an optical system disposed with respect to the source array and the detector array so as to illuminate an object with light from the source array and image the object on the detector array, corresponding detectors of the detector array and sources of the source array being disposed in back of the optical system and being arranged so that light radiated from a point on the object illuminated by a given source of the source array is detected by a corresponding detector of the detector array, the optical system comprising a microscope; and an energy splitting element disposed between the optical system, on the one hand, and the detectors and sources, on the other hand, to produce conjugate points in image space coupled respectively to corresponding sources and detectors, wherein the energy splitting element comprises a Wollaston prism, the imaging system further comprising a circular polarizer disposed between the optical system and the Wollaston prism so as to produce polarization components along both eigenaxes of the Wollaston prism.

8. An imaging system, comprising:

a plurality of light detectors arranged in a detector array;

a plurality of light sources corresponding to detectors in the detector array and arranged in a source array;

an optical system disposed with respect to the source array and the detector array so as to illuminate an object with light from the source array and image the object on the detector array, corresponding detectors of the detector array and sources of the source array being disposed in back of the optical system and being arranged so that light radiated from a point on the object illuminated by a given source of the source array is detected by a corresponding detector of the detector array, the optical system comprising a microscope; and an energy splitting element disposed between the optical system, on the one hand, and the detectors and sources, on the other hand, to produce conjugate points in image space coupled respectively to corresponding sources and detectors, wherein the sources emit light at a first wavelength, the detectors respond to light at a second wavelength different from the first wavelength, and the energy splitting element comprises a direct view prism.

9. An imaging system, comprising:

a plurality of light detectors arranged in a detector array;

a plurality of light sources corresponding to detectors in the detector array and arranged in a source array;

a confocal microscope disposed with respect to the source array and the detector array so as to illuminate an object with light from the source array and image the object on the detector array, corresponding detectors of the detector array and sources of the source array being disposed in back of the optical system and being arranged so that light radiated from a point on the object illuminated by a given source of the source array is detected by a corresponding detector of the detector array, the light sources being interspersed among the light detectors; and an energy splitting element disposed between the confocal microscope, on the one hand, and the detectors and sources, on the other hand, to produce conjugate points in image space coupled respectively to corresponding sources and detectors.

10. An imaging system, comprising:

a plurality of light detectors arranged in a detector array;

a plurality of light sources corresponding to detectors in the detector array and arranged in a source array;

an optical system disposed with respect to the source array and the detector array so as to illuminate an object with light from the source array and image the object on the detector array, corresponding detectors of the detector array and sources of the source array being disposed in back of the optical system and being arranged so that light radiated from a point on the object illuminated by a given source of the source array is detected by a corresponding detector of the detector array, the optical system comprising a microscope; and an energy splitting element disposed between the optical system, on the one hand, and the detectors and sources, on the other hand, to produce conjugate points in image space coupled respectively to corresponding sources and detectors, wherein the energy splitting element comprises a diffractive element optimized to maximize energy in diffraction orders directed respectively toward corresponding detectors and sources.

11. An imaging system, comprising:

a plurality of light detectors arranged in a detector array;

a plurality of light sources corresponding to detectors in the detector array and arranged in a source array;

an optical system disposed with respect to the source array and the detector array so as to illuminate an object with light from the source array and image the object on the detector array, corresponding detectors of the detector array and sources of the source array being disposed in back of the optical system and being arranged so that light radiated from a point on the object illuminated by a given source of the source array is detected by a corresponding detector of the detector array, the optical system comprising a microscope; and an energy splitting element disposed between the optical system, on the one hand, and the detectors and sources, on the other hand, to produce conjugate points in image space coupled respectively to corresponding sources and detectors, wherein the energy splitting element comprises a Wollaston prism, the imaging system further comprising a linear polarizer disposed between the optical system and the Wollaston prism so as to produce polarization components along both eigenaxes of the Wollaston prism.

12. An imaging system, comprising:

a plurality of light detectors arranged in a detector array;

a plurality of light sources corresponding to detectors in the detector array and arranged in a source array;

an optical system disposed with respect to the source array and the detector array so as to illuminate an object with light from the source array and image the object on the detector array, corresponding detectors of the detector array and sources of the source array being disposed in back of the optical system and being arranged so that light radiated from a point on the object illuminated by a given source of the source array is detected by a corresponding detector of the detector array, the optical system comprising a microscope; and an energy splitting element disposed between the optical system, on the one hand, and the detectors and sources, on the other hand, to produce conjugate points in image space coupled respectively to corresponding sources and detectors, wherein the sources emit light at a first wavelength, the detectors respond to light at a second wavelength different from the first wavelength, and the energy splitting element comprises a direct view prism.

13. An imaging system, comprising:

a plurality of light detectors arranged in a detector array;

a plurality of light sources corresponding to detectors in the detector array and arranged in a source array;

an optical system disposed with respect to the source array and the detector array so as to illuminate an object with light from the source array and image the object on the detector array, corresponding detectors of the detector array and sources of the source array being disposed in back of the optical system and being arranged so that light radiated from a point on the object illuminated by a given source of the source array is detected by a corresponding detector of the detector array, the optical system comprising a microscope; and an energy splitting element disposed between the optical system, on the one hand, and the detectors and sources, on the other hand, to produce conjugate points in image space coupled respectively to corresponding sources and detectors, wherein the microscope includes a diffractive element disposed on the detector side thereof and optimized to maximize efficiency in orders of diffraction corresponding respectively to corresponding detectors and sources.

14. An imagine system, comprising:

a plurality of light detectors arranged in a detector array;

a plurality of light sources corresponding to detectors in the detector array and arranged in a source array;

an array of microscopes corresponding to respective detectors of the detector array, the microscopes illuminating an object with light from respective sources of the source array and producing respective images of the object at their respective detectors, corresponding detectors of the detector array and sources of the source array being disposed in back of the microscope array and being arranged so that light radiated from a point on the object illuminated by a given source of the source array is detected by a corresponding detector of the detector array, the light sources being interspersed among the light detectors, corresponding detectors and sources being coplanar with one another; and energy splitting elements disposed between corresponding microscopes, on the one hand, and their corresponding detectors and sources, on the other hand, to produce conjugate points in image space coupled respectively to corresponding sources and detectors.

15. An imaging system, comprising:

a plurality of light detectors arranged in a detector array;

a plurality of light sources corresponding to detectors in the detector array and arranged in a source array;

an array of optical elements corresponding to respective detectors of the detector array, the optical elements illuminating an object with light from respective sources of the source array and producing respective images of the object at their respective detectors, corresponding detectors of the detector array and sources of the source array being disposed in back of their respective optical elements and being arranged so that light radiated from a point on the object illuminated by a given source of the source array is detected by a corresponding detector of the detector array, the optical elements comprising microscopes; and energy splitting elements disposed between corresponding microscopes, on the one hand, and their corresponding detectors and sources, on the other hand, to produce conjugate points in image space coupled respectively to corresponding sources and detectors, wherein the energy splitting elements comprise diffractive elements optimized to maximize energy directed respectively toward corresponding detectors and sources.

16. An imaging system, comprising:

a plurality of light detectors arranged in a detector array;

a plurality of light sources corresponding to detectors in the detector array and arranged in a source array;

an array of optical elements corresponding to respective detectors of the detector array, the optical elements illuminating an object with light from respective sources of the source array and producing respective images of the object at their respective detectors, corresponding detectors of the detector array and sources of the source array being disposed in back of their respective optical elements and being arranged so that light radiated from a point on the object illuminated by a given source of the source array is detected by a corresponding detector of the detector array, the optical elements comprising microscopes; and energy splitting elements disposed between corresponding microscopes, on the one hand, and their corresponding detectors and sources, on the other hand, to produce conjugate points in image space coupled respectively to corresponding sources and detectors, wherein the energy splitting elements comprise Wollaston prisms, the imaging system further comprising circular polarizers disposed between the microscopes and their respective Wollaston prisms so as to produce polarization components along both eigenaxes of the Wollaston prisms.

17. An imaging system, comprising:

a plurality of light detectors arranged in a detector array;

a plurality of light sources corresponding to detectors in the detector array and arranged in a source array;

an array of optical elements corresponding to respective detectors of the detector array, the optical elements illuminating an object with light from respective sources of the source array and producing respective images of the object at their respective detectors, corresponding detectors of the detector array and sources of the source array being disposed in back of their respective optical elements and being arranged so that light radiated from a point on the object illuminated by a given source of the source array is detected by a corresponding detector of the detector array, the optical elements comprising microscopes; and energy splitting elements disposed between corresponding microscopes, on the one hand, and their corresponding detectors and sources, on the other hand, to produce conjugate points in image space coupled respectively to corresponding sources and detectors, wherein the sources emit light at a first wavelength, the detectors respond to light at a second wavelength different from the first wavelength, and the energy splitting elements comprises a direct view prism.

18. An imaging system, comprising:

a plurality of light detectors arranged in a detector array:

a plurality of light sources corresponding to detectors in the detector array and arranged in a source array;

an array of microscopes corresponding to respective detectors of the detector array, the microscopes illuminating an object with light from respective sources of the source array and producing respective images of the object at their respective detectors, corresponding detectors of the detector array and sources of the source array being disposed in back of their respective optical elements and being arranged so that light radiated from a point on the object illuminated by a given source of the source array is detected by a corresponding detector of the detector array, the optical elements comprising microscopes: and energy splitting elements disposed between corresponding microscopes, on the one hand, and their corresponding detectors and sources, on the other hand, to produce conjugate points in image space coupled respectively to corresponding sources and detectors, wherein the sources emit light at a first wavelength and the detectors respond to light at a second wavelength different from the first wavelength, for epi-fluoresence microscopy.

19. An imaging system, comprising:

a plurality of light detectors arranged in a detector array;

a plurality of light sources corresponding to detectors in the detector array and arranged in a source array; and an optical system disposed with respect to the source array and the detector array so as to illuminate an object with light from the source array and image the object on the detector array, corresponding detectors of the detector array and sources of the source array being disposed in back of the optical system and being arranged so that light radiated from a point on the object illuminated by a given source of the source array is detected by a corresponding detector of the detector array, the light sources being interspersed among the light detectors, and wherein the sources emit light at a first wavelength and the detectors respond to light at a second wavelength different from the first wavelength for epi-fuoresence microscopy.

20. A method for providing epi-illumination in an imaging system, comprising:
arranging in an array a plurality of light detectors in back of the imaging system so as to receive an image produced by the imaging system;
arranging in an array a plurality of light sources corresponding to respective said light detectors so as to provide illumination in front of the imaging system, the light sources being interspersed among the light detectors; and
providing a diffractive optical element in back of the imaging system so as to produce conjugate points coupled respectively to corresponding sources and detectors.

21. A method for providing epi-illumination in an imaging system, comprising:
arranging in an array a plurality of light detectors in back of the imaging system so as to receive an image produced by the imaging system;
arranging in an array a plurality of light sources corresponding to respective said light detectors so as to provide illumination in front of the imaging system, wherein the sources emit light at a first wavelength and the detectors respond to a second, different wavelength, the light sources being interspersed among the light detectors; and
providing a dispersive optical element in back of the imaging system so as to produce conjugate points coupled respectively to corresponding sources and detectors.

22. A method for providing epi-illumination in an imaging system, comprising:
arranging in an array a plurality of light detectors in back of the imaging system so as to receive an image produced by the imaging system;
arranging in an array a plurality of light sources corresponding to respective said light detectors so as to provide illumination in front of the imaging system, the light sources being interspersed among the detectors;
placing an object at a position in front of the imaging system so that, in producing an image of the object, the imaging system operates as a microscope; and
providing an optical element in back of the imaging system so as to produce conjugate points coupled respectively to corresponding sources and detectors.

23. The method of claim 22, wherein providing an optical element comprises providing a diffractive optical element.

24. The method of claim 22, wherein providing an optical element comprises providing a refractive optical element.

25. The method of claim 22, wherein the sources emit light at a first wavelength and the detectors respond to a second, different wavelength, and providing an optical element comprises providing a dispersive optical element.

26. A method for providing epi-illumination in an imaging system, comprising:
arranging in an array a plurality of light detectors in back of the imaging system so as to receive an image produced by the imaging system;
arranging in an array a plurality of light sources corresponding to respective said light detectors so as to provide illumination in front of the imaging system, the light sources being interspersed among the light detectors;
placing an object at a position in front of the imaging system so that, in producing an image of the object, the imaging system operates as a microscope; and
placing in front of the array of detectors a stop having a plurality of apertures corresponding to the detectors, and producing relative movement between the object and the optical system so that, in producing an image of the object, the imaging system operates as a confocal microscope.

27. The method of claim 26, further comprising providing an optical element in back of the imaging system so as to produce conjugate points coupled respectively to corresponding sources and detectors.

28. The method of claim 27, wherein providing an optical element comprises providing a diffractive optical element.

29. The method of claim 27, wherein providing an optical element comprises providing a refractive optical element.

30. The method of claim 27, wherein the sources emit light at a first wavelength and the detectors respond to a second, different wavelength, and providing an optical element comprises providing a dispersive optical element.

31. The method of claim 26, further comprising arranging the detectors and the sources so that some points on the object plane of the optical system produce respective images that encompass a detector and a source corresponding thereto.

32. A method for providing epi-illumination in an imaging system, comprising:
arranging in an array a plurality of light detectors in back of the imaging system so as to receive an image produced by the imaging system;
arranging in an array a plurality of light sources corresponding to respective said light detectors so as to provide illumination in front of the imaging system, the light sources being interspersed among the light detectors; forming the imaging system from a plurality of discrete optical systems arranged in an array so that corresponding sources and detectors correspond to a discrete optical system; and
placing an object at a position in front of the imaging system so that, in producing an image of the object, the discrete optical systems operate as an array microscope.

33. The method of claim 32, further comprising providing one or more optical elements in back of the imaging system so as to produce conjugate points coupled respectively to corresponding sources and detectors.

34. The method of claim 33, wherein providing one or more optical elements comprises providing one or more diffractive optical elements.

35. The method of claim 33, wherein providing one or more optical elements comprises providing one or more refractive optical elements.

36. The method of claim 33, further comprising arranging the detectors and the sources so that some points on the object plane of a discrete optical system produce respective images that encompass a detector and source corresponding thereto.

37. The method of claim 32, further comprising placing in front of the array of detectors a stop having a plurality of apertures corresponding to the detectors, and producing relative movement between the object and the optical system so that, in producing an image of the object, the imaging system operates as a confocal microscope.

38. The method of claim 32, further comprises providing light sources that produce light at a first wavelength for exciting fluorescence by an object at a second wavelength, and providing light detectors that detect light at the second wavelength, so that the imaging system operates as an epi-fluorescence microscope.

39. A method for providing epi-illumination in an imaging system, comprising:

arranging in an array a plurality of light detectors in back of the imagine system so as to receive an image produced by the imaging system;

arranging in an array a plurality of light sources corresponding to respective said light detectors so as to provide illumination in front of the imaging system, the light sources being interspersed among the light detectors; and placing an object at a position in front of the imaging system, providing light sources that produce light at a first wavelength for exciting fluorescence by an object at a second wavelength, and providing light detectors that detect light at the second wavelength, so that the imaging system operates as an epi-fluorescence microscope.

* * * * *